United States Patent
Nagashima

(10) Patent No.: US 6,762,962 B2
(45) Date of Patent: Jul. 13, 2004

(54) MEMORY SYSTEM CAPABLE OF OVERCOMING PROPAGATION DELAY DIFFERENCES DURING DATA WRITE

(75) Inventor: Osamu Nagashima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/357,577

(22) Filed: Feb. 4, 2003

(65) Prior Publication Data

US 2003/0218918 A1 Nov. 27, 2003

(30) Foreign Application Priority Data

Feb. 4, 2002 (JP) .................................. 2002/026796

(51) Int. Cl.[7] .............................................. G11C 7/22
(52) U.S. Cl. ..................... 365/194; 365/233; 365/236; 365/63; 365/51; 365/191
(58) Field of Search ............................. 365/233, 236, 365/51, 63, 194, 198, 191

(56) References Cited

U.S. PATENT DOCUMENTS 6,535,950 B1 * 3/2003 Funyu et al. ................ 711/106
6,608,784 B2 * 8/2003 Kanamori et al. .......... 365/200

* cited by examiner

Primary Examiner—Andrew Q. Tran
(74) Attorney, Agent, or Firm—Scully, Scott, Murphy & Presser

(57) ABSTRACT

DRAM device enters waiting state of write flag on receiving write command from memory controller via external C/A bus, regulator, and internal C/A bus. On receiving the write flag from the memory controller via write flag signal line, the DRAM device uses the write flag as count start point to start counting a predetermined number of clocks. The DRAM device uses a point at which the predetermined number of clocks have been counted as a taking-in start point of write data to take in the write data propagated through DQ bus. Transmission path of the write flag has topology equal to that of the transmission path of the write data. It can be considered that propagation delays in two transmission paths are equal. By the above defining of the taking-in start point, the DRAM device can appropriately take in the write data regardless of the propagation delay.

16 Claims, 5 Drawing Sheets

MEMORY SYSTEM CAPABLE OF OVERCOMING PROPAGATION DELAY DIFFERENCES DURING DATA WRITE

BACKGROUND OF THE INVENTION

The present invention relates to a memory system comprising a memory module on which a plurality of memory devices are mounted and a memory controller, particularly to data write control in the memory system.

In general, in memory systems such as SDR, DDR-I, and DDR-II, in consideration of time to decode a write command in a memory device, data write latency is set indicating the number of clocks from when the write command is inputted into the memory device until write data starts to be taken in. In this system, a memory controller sends the write command. On the other hand, in consideration of the data write latency, after elapse of a predetermined number of clocks from the write command, the controller sends the write data onto a data bus (DQ bus). Subsequently, on receiving the write command, the memory device uses the write command as a count start point to count the number of clocks corresponding to the data write latency, and starts taking in the write data propagated on the DQ bus from a point at which the counting has ended.

In general, a plurality of memory devices are mounted on a memory module. Therefore, unless a wiring on the memory module is an isometric wiring, a transmission path length of the write command to each memory device differs. As a result, a difference is generated in a timing at which the write command outputted from the memory controller reaches each memory device. Moreover, different memory modules also have a difference in the transmission path length on a mother board. Therefore, the difference is generated in the timing at which the write command reaches each memory device. This difference of the reach timing of the write command, that is, the difference of command propagation delay in the memory module or memory system becomes remarkable with an increase of the number of memory devices mounted on the memory module.

The difference of the command propagation delay sometimes causes a problem that a clock domain is exceeded with a high clock frequency. This will be described hereinafter. In the following, a command/address signal is referred to as a C/A signal, and a bus for transmitting the C/A signal is referred to as a C/A bus. Particularly, the C/A bus to the memory module from the memory controller is referred to as an external C/A bus, and the C/A bus on the module is referred to as an internal C/A bus For example, the use of a single T-branch will be described including a one-stage hierarchy structure which is topology of the bus of the C/A signal on the memory module. In this case, a clock at a time when the write command reaches the memory device closest, to a branch point sometimes differs from a clock at a time when the write command reaches the memory device farthest from the branch point. In this case, as in a related art, an input start point of the write data is defined only by the number of clocks from the write command. Then, a deviation is generated between an original data start time and a point at which the memory device starts taking in the write data, and an erroneous operation is sometimes caused.

Particularly in the memory system, the C/A bus, DQ bus, and clock bus are disposed independently of one another. For a data write operation, an operation has been proposed in which a transmission path of the write command to the memory device from the memory controller is different from a transmission path of the write data. In this memory system, a possibility that the erroneous operation is caused further increases.

The following technique has been proposed with respect to the problem. A register is disposed on the memory module, the latency is set to be variable, and the number of clocks from when the write command is inputted until the write data starts to be inputted is controlled on a register side. However, for the reason that a control content is complicated, there has been a demand for another method which can solve the above-described problem.

SUMMARY OF THE INVENTION

An object of the present invention is to provide a memory system in which a plurality of memory devices can appropriately start taking in data regardless of register control and a method for the system.

The present invention is based on the following idea. A clock count start point for taking in write data is set to a newly defined write flag reach point, not a write command reach point in a memory device as in the related art. Thereby, a degree of freedom in bus constitution can be raised. This write flag is used, and especially transmission paths of the write flag and write data to each memory device are constituted of the same topology. Then, a phase relation between the write flag and write data in each memory device becomes constant. Therefore, the above-described problem by the propagation delay of write command can be avoided. Moreover, since the write flag is used to raise the degree of freedom of the bus constitution, the transmission paths of the write command and write flag can also be constituted of the same topology. If possible, output timings can be considered to be adjusted on a memory controller side.

Based on this idea, the present invention provides the following data writing methods and memory systems.

That is, according to the present invention, there is provided a first data writing method in a memory system including a memory module on which a plurality of memory devices are mounted and a memory controller which executes a write control with respect to the memory devices. In the first data writing method, a write flag is defined, and the memory device is constituted to hold a predetermined number of clocks and to count the predetermined number of clocks in response to the write flag. To execute the write control, the memory controller successively inputs write command, write flag, and write data into the memory device. Thereby, the memory device uses a point at which the predetermined number of clocks have elapsed from write flag input as a start point for taking in the write data.

A second data writing method according to the present invention is applied to the first data writing method. In the second data writing method, the memory system is constituted so that a transmission path of the write flag to the memory device from the memory controller has the same topology as that of a transmission path of the write data to the memory device from the memory controller.

A third data writing method according to the present invention is applied to the second data writing method. In the third data writing method, the write data and write flag are directly inputted into the plurality of memory devices from the memory controller.

A fourth data writing method according to the present invention is applied to the third data writing method. In the fourth data writing method, a regulator for temporarily holding the write command on the memory module is mounted, and an internal bus for transmitting the write command to the plurality of memory devices from the regulator is mounted. The write command is inputted into the memory device from the memory controller via the regulator and internal bus.

A fifth data writing method according to the present invention is applied to the first data writing method. In the fifth data writing method, the memory system is constituted so that the transmission path of the write flag to the memory device from the memory controller has a topology different from that of the transmission path of the write data to the memory device from the memory controller.

A sixth data writing method according to the present invention is applied to the fifth data writing method. In the sixth data writing method, the write data is directly inputted into the plurality of memory devices from the memory controller.

A seventh data writing method according to the present invention is applied to the sixth data writing method. In the seventh data writing method, a regulator for temporarily holding the write command and write flag on the memory module is mounted, and first and second internal buses for transmitting the write command and write flag to the plurality of memory devices from the regulator are mounted. The write command and write flag are inputted into the memory device from the memory controller via the regulator and first and second internal buses.

Moreover, according to the present invention, there is provided the following first memory system. The first memory system includes a memory controller which outputs a write flag, write command, and write data. The first memory system further includes a memory module including a plurality of memory devices which hold a predetermined number of clocks and which enter a waiting state of the write flag on receiving the write command and which start taking in the write data from a point of elapse of the predetermined number of clocks from the write flag on receiving the write flag.

A second memory system according to the present invention is applied to the first memory system. In the second memory system, a first transmission path which is a transmission path of the write flag to the memory device from the memory controller has the same topology as that of a second transmission path which is a transmission path of the write data to the memory device from the memory controller.

A third memory system according to the present invention is applied to the second memory system. In the third memory system, the first transmission path includes DQ buses connected to the plurality of memory devices, and the second transmission path includes a WFLG signal line connected to the plurality of memory devices.

A fourth memory system according to the present invention is applied to the third memory system. The fourth memory system further includes an external command/address bus which transmits a command/address signal including the write command to the memory module from the memory controller. The memory module includes a regulator for temporarily holding the command/address signal, and an internal command/address bus for distributing the command/address signal to the respective memory devices from the regulator. The transmission path of the write command to the memory device from the memory controller includes the external command/address bus, regulator, and internal command/address bus, and includes a topology different from that of the first and second transmission paths.

A fifth memory system according to the present invention is applied to the first memory system. In the fifth memory system, a first transmission path which is a transmission path of the write flag to the memory device from the memory controller has a topology different from that of the second transmission path which is a transmission path of the write data to the memory device from the memory controller.

A sixth memory system according to the present invention is applied to the fifth memory system. The sixth memory system further includes an external command/address bus and WFLG signal line for transmitting the command/address signal including the write command, and the write flag to the memory module from the memory controller, and a plurality of DQ buses for transmitting the write data to the plurality of memory devices from the memory controller. The second transmission path includes a plurality of DQ buses.

A seventh memory system according to the present invention is applied to the sixth memory system. In the seventh memory system, the memory module includes a regulator for temporarily holding the command/address signal and write flag, and an internal command/address bus and internal WFLG bus for distributing the command/address signal and write flag to each memory device from the regulator. The first transmission path includes the WFLG signal line, regulator, and internal WFLG bus. The transmission path of the write command to the memory device from the memory controller has a topology which is the same as that of the first transmission path and which is different from that of the second transmission path.

Furthermore, according to the present invention, there is provided the following memory module. On the memory module, a plurality of memory devices are mounted for use in a memory system including a memory controller for outputting a write command, write flag, and write data for a data write operation. In the present memory module, each of the plurality of memory devices enters a waiting state of the write flag on receiving the write command from the memory controller. Each of the plurality of memory devices starts counting a predetermined number of clocks from the write flag which is used as a count start point on receiving the write flag, and starts taking in the write data from a point at which the predetermined number of clocks have been counted.

Additionally, according to the present invention, there is provided the following memory controller. The present memory controller includes a command output portion for outputting a write command, and a write flag output portion for outputting a write flag which corresponds to the write command and which indicates a count start point for counting clocks to specify a taking-in start point of the write data in the memory device. The present memory controller further includes a data output portion for outputting the write data corresponding to the write command after elapse of a predetermined time in consideration of write data latency from when the write flag output portion outputs the write flag.

DESCRIPTION OF THE PREFERRED EMBODIMENTS

A memory system according to embodiments of the present invention and a data writing method in the system will be described hereinafter in detail.

(First Embodiment)

Figure 1:
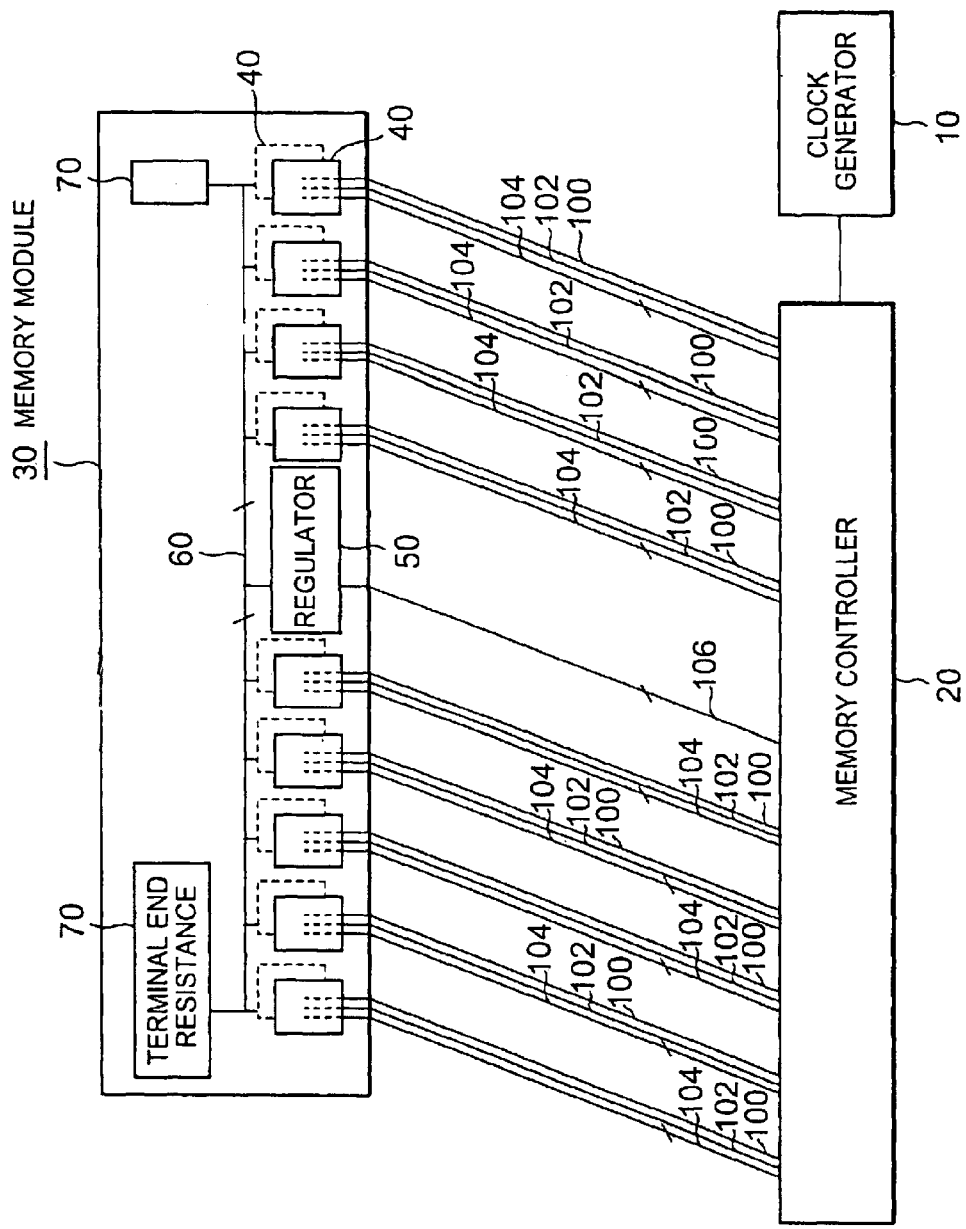
FIG. 1 is a diagram schematically showing the whole constitution of a memory system according to a first embodiment of the present invention.

As shown in FIG. 1, a memory system according to a first embodiment of the present invention includes a clock generator 10, memory controller (chip set) 20, and memory module 30. A plurality of DRAM devices 40 are mounted on the memory module 30. In the present embodiment, the memory controller 20 generates a reference clock based on the clock generated by the clock generator 10. Various operations in the memory system are executed based on the generated reference clock. In general, a plurality of memory modules 30 are disposed, but to simplify the description, FIG. 1 shows only one memory module 30. In the following, the memory module 30 is used for the description unless otherwise described.

Write flag (WFLG) signal lines 100, reference clock (WCLK) signal lines 102, DQ buses 104, and an external C/A bus 106 are arranged between the memory controller 20 and memory module 30. Here, a bunch of input/output signal lines of data regarding one memory module 30 is sometimes generically referred to as the DQ bus. However, in the present specification, the bunch of signal lines which input/output data with respect to each DRAM device 40 is referred to as the DQ bus 104. Moreover, the various signal lines/buses are usually disposed on a mother board (not shown), and connected to the memory module 30 via connectors (not shown) attached onto the mother board. However, also to simplify the description, the connections are omitted from the drawing. It is to be noted that the concrete connections of the various signal lines/buses will be described after the description of constituting elements on the memory module.

On the memory module 30, the plurality of DRAM devices (memory devices) 40, a regulator 50 for temporarily holding a C/A signal, an internal C/A bus 60 for connecting the regulator 50 to each memory device 40, and terminal-end resistances 70 connected to the internal CIA bus 60 are disposed, The internal C/A bus 60 includes a one-stage hierarchy bus structure (so-called single T-branch structure). The terminal-end resistances 70 have a function of preventing the C/A signal from being reflected on the internal C/A bus 60. On the shown memory module 30, nine DRAM devices on one surface, that is, 18 DRAM devices 40 in total are mounted. Here, examples of the regulator 50 include a register and buffer.

As apparent from FIG. 1, in the present embodiment, each WFLG signal line 100 includes a stub structure, and is connected to each of the plurality of DRAM devices 40 mounted on the same surface of the memory module 30 with an equal path length. Similarly, each WCLK signal line 102 and DQ bus 104 also have the stub structures, and have equal path lengths with respect to the plurality of DRAM devices 40 mounted on the same surface of the memory module 30. Furthermore, as understood from FIG. 1, the WFLG signal line 100, WCLK signal line 102, and DQ bus 104 with respect to one DRAM device 40 have the same topology. Therefore, the transmission path lengths of the write flag, reference clock, and (write) data extending to one DRAM device 40 from the memory controller 20 are equal to one another.

On the other hand, the external C/A bus 106 for transmitting the C/A signal also has the stub structure, but an input destination of the C/A signal in each memory module 30 is the regulator 50, not each DRAM device 40. Furthermore, the C/A signal outputted from the memory controller 20 and propagated through the external C/A bus 106 is temporarily held in the regulator 50 as described above, and subsequently transmitted to each DRAM device 40 through the internal C/A bus 60. Therefore, the transmission path of the C/A signal including the write command includes the external C/A bus 106, regulator 50, and internal C/A bus 60. Therefore, when seen from the DRAM device 40, the transmission path of the C/A signal is apparently different from the transmission paths of the write flag, reference clock, and (write) data.

It is to be noted that in the present embodiment the difference of the path length to each DRAM device 40 from the memory controller 20 is considered. The memory controller 20 outputs the clock having the same phase as that of the reference clock and data to each DRAM device 40 so that the C/A signal can appropriately be received in each DRAM device 40. That is, a clock (referred to as a C/A clock) outputted from the memory controller 20 at the same timing as that of the reference clock is supplied to the external C/A bus 106, regulator 50, and internal C/A bus 60 for each DRAM device. Thereby, each DRAM device 40 can appropriately receive the C/A signal propagated through the transmission path having the same path length in accordance with the C/A clock. Additionally, as apparent from the transmission path, the C/A clock reaches the DRAM device 40 at a timing different from that of the reference clock (WCLK).

The constitutions of the memory controller 20 and DRAM device 40 will be described with reference to FIGS. 2 and 3 The operations will also be described with reference to FIG. 4.

Figure 2:
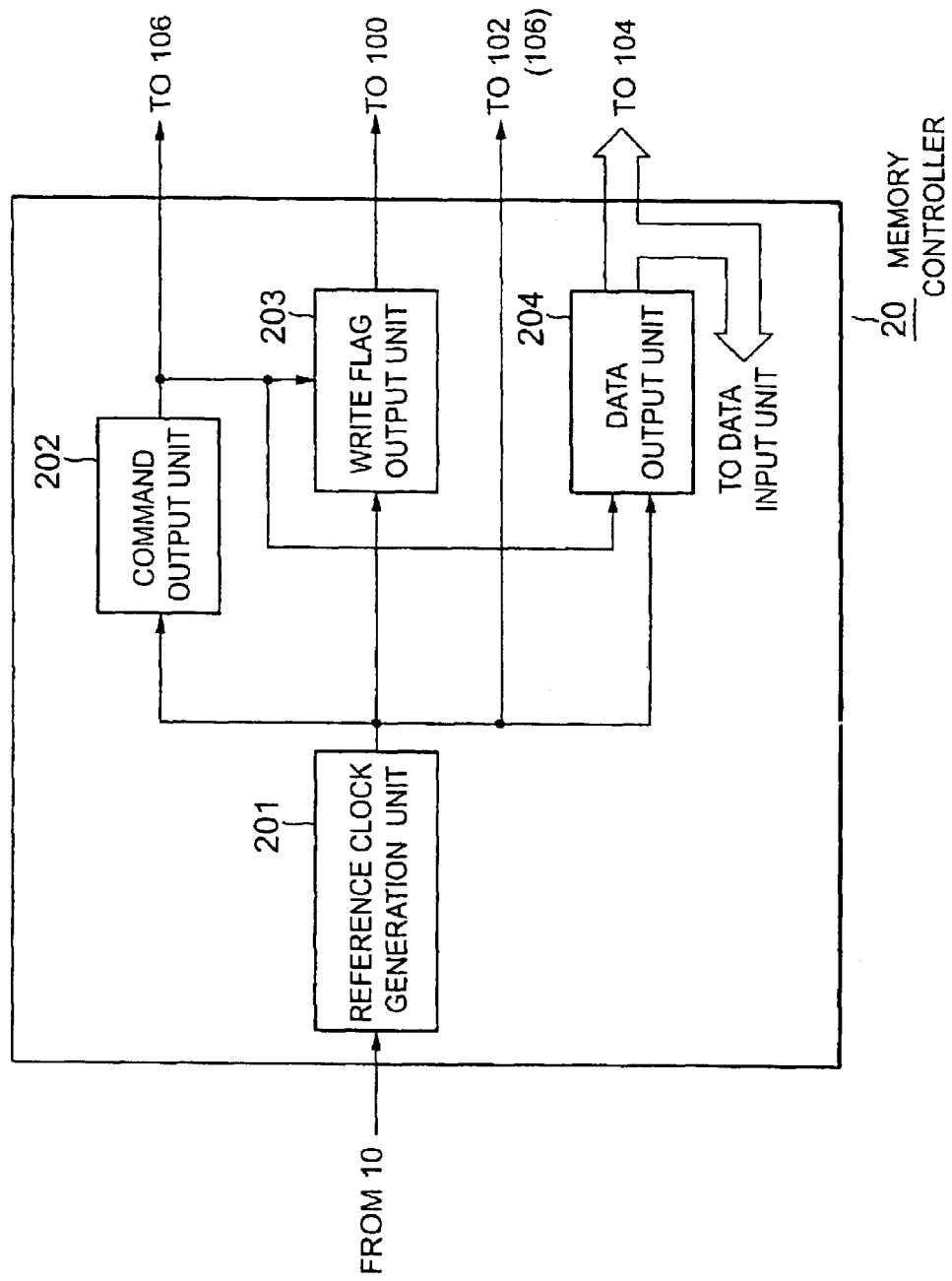
FIG. 2 is a schematic constitution diagram of a memory controller shown in FIG. 1.

Referring to FIG. 2, the memory controller 20 includes a reference clock generation unit 201, command output unit 202, write flag output unit 203, and data output unit 204. The memory controller 20 usually includes other constituting elements, but the elements are not directly related to the present invention, and are therefore omitted from the drawing, and the description will be omitted.

The reference clock generation unit 201 receives the clock from the clock generator 10, and generates the reference clock (WCLK) of the memory system based on the received clock. The generated reference clock is outputted to the WCLK signal line 102, and outputted as the C/A clock to the external C/A bus 106 (see CACLK @ MC and WCLK @ MC of FIG. 4). The reference clock is also inputted as an operation reference in the memory controller 20 into the command output unit 202, write flag output unit 203, and data output unit 204.

Figure 4:
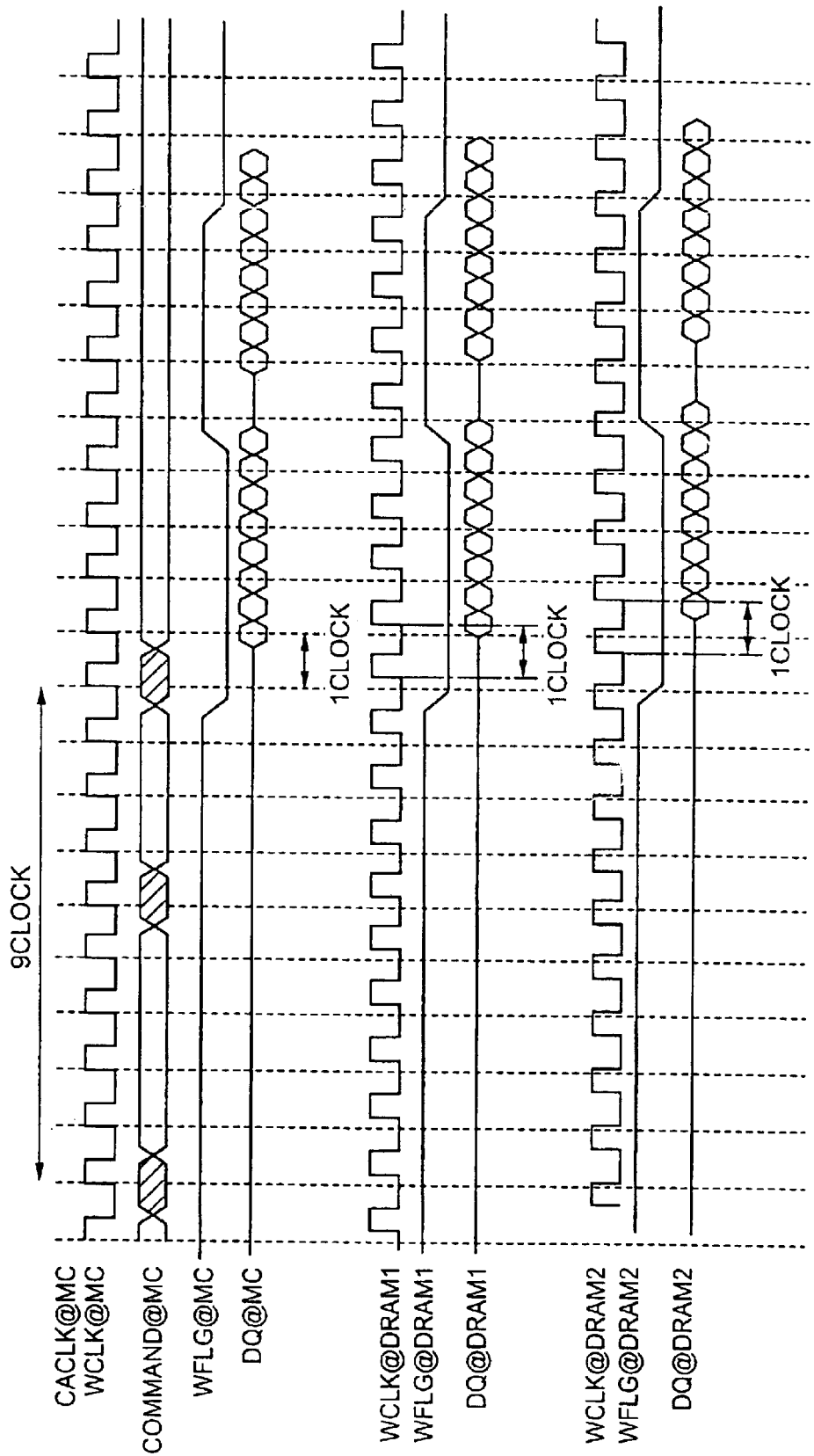
FIG. 4 is a timing chart showing an operation in the first embodiment.

The command output unit 202 outputs a command so that a rising point of the reference clock coincides with the vicinity of an intermediate point of each bit constituting the command (see Command @ MC in FIG. 4).

As described above, the C/A clock and command are transmitted to each DRAM device 40 through the same transmission path. Thereby, in each DRAM device 40, the command outputted as described above can appropriately be received in synchronization with the C/A clock. Among the commands, at least the write command is also inputted into the write flag output unit 203 and data output unit 204 in the present embodiment.

When the write flag output unit 203 receives the write command from the command output unit 202 and a predetermined number of clocks (nine clocks in the present embodiment) (see FIG. 4) elapse, the write flag output unit reverses the level of the WFLG signal line 100 (see WFLG @ MC in FIG. 4). As apparent from the above description, the write flag in the present embodiment is of a toggle type. Regardless of a high or low level, the reversing of the signal level from the previous state means a so-called "flagged" state. Instead of this constitution, the line is usually in the low level. On the other hand, the "flagged state" may also be constituted to be the high level.

The data output unit 204 receives the write command from the command output unit 202. In ten clocks after this point, that is, one clock after the write flag output unit 203 raises the write flag, the data output unit outputs the write data onto the DQ bus 104. As apparent from this description, in the shown example, the command output unit 202 inputs the write command into the data output unit 204. However, the write flag output unit 203 may also input the write flag into the data output unit 204. Moreover, as apparent from FIG. 4, the memory system in the present embodiment is of a DDR system, and especially the shown example is an example of burst transfer of eight bits.

Figure 3:
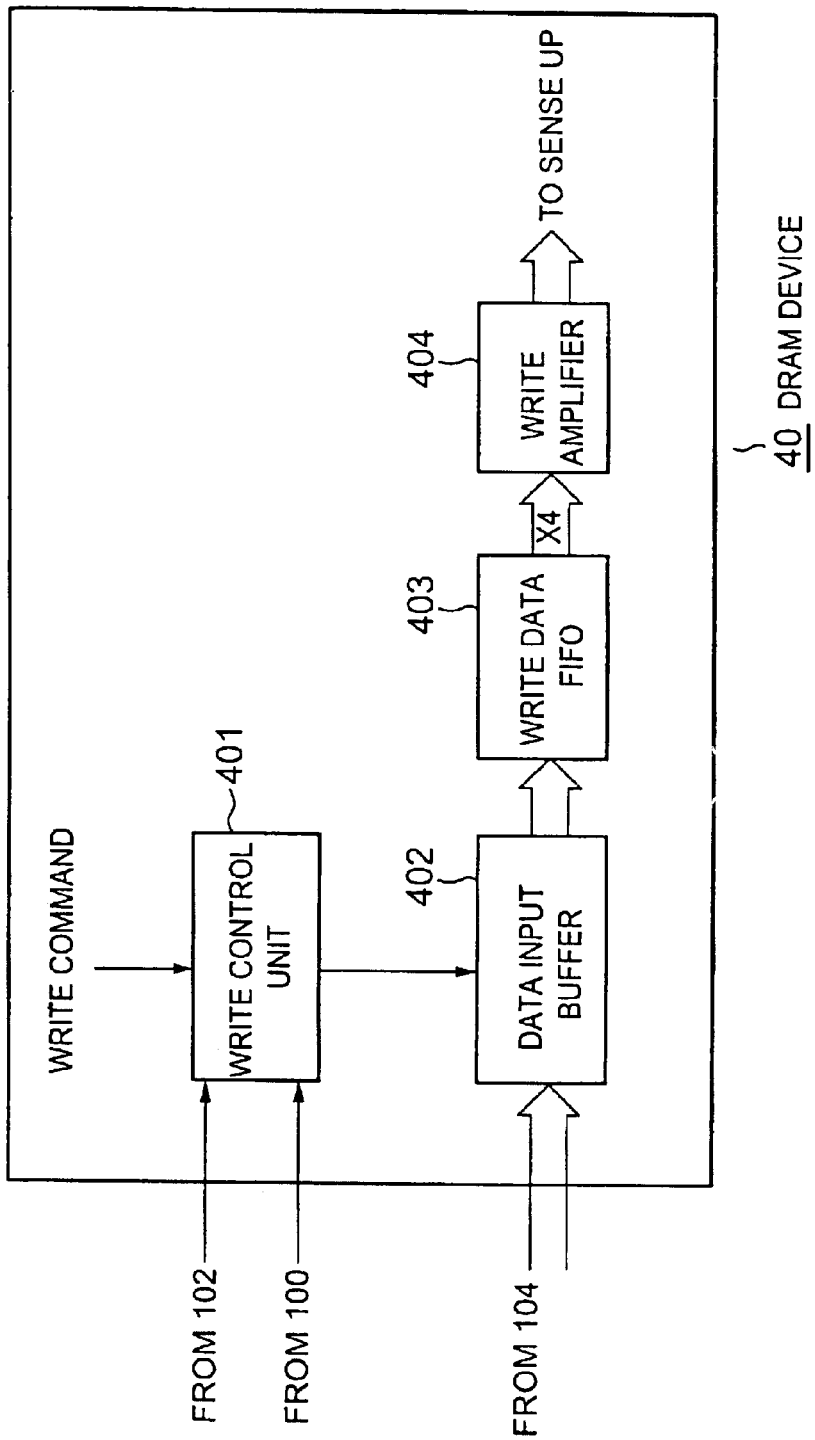
FIG. 3 is a schematic constitution diagram of a DRAM device shown in FIG. 1.

Referring to FIG. 3, the DRAM device 40 includes a write control unit 401, data input buffer 402, write data FIFO (First-In First-Out) 403, and write amplifier 404. Also in FIG. 3, to simplify the description, the constituting elements which are not directly related to the present invention, such as a memory cell array, row decoder, and column decoder, are omitted from the drawing, and the description thereof is omitted.

The write control unit 401 receives the write command, and also receives the write flag and reference clock propagated through the WFLG signal line 100 and WCLK signal line. The write command may be a command which is directly received via the internal C/A bus 60 and decoded by the write control unit 401 or which is obtained as a decoded result of the command by another constituting element (not shown). Additionally, the write control unit 401 in the present embodiment needs to include at least an element which knows that the write command is inputted into the DRAM device 40.

On receiving the write command, the write control unit 401 enters a waiting state until the write flag is next flagged. When the write flag is flagged, the write control unit 401 uses the write flag as a count start point to start counting the predetermined number of clocks (one clock in the present embodiment). Moreover, when the predetermined number of clocks are counted, a buffer control signal is outputted toward the data input buffer 402.

The data input buffer 402 in the present embodiment includes latch elements such as a flip-flop, Therefore, the above-described buffer control signal is a trigger signal for controlling the latch operation. It is to be noted that the operation in the write control unit 401 is performed in synchronization with the reference clock propagated through the WCLK signal line 102. Moreover, the buffer control signal is also similarly synchronized with the reference clock. Therefore, the operation of the data input buffer 402 described in the following is also synchronized with the reference clock (see WCLK @ DRAM1 and WFLG @ DRAM1 in FIG. 4).

On receiving the buffer control signal from the write control unit 401, the data input buffer 402 starts taking in the write data propagated on the DQ bus 104 at the reception timing (see WCLK @ DRAM1 and DQ @ DRAM1 in FIG. 4).

In this manner, the write data taken into the data input buffer 402 is inputted into the write data FIFO 403, and inputted and amplified in the write amplifier 404 with a bit width of ×4. That is, the DRAM device 40 in the present embodiment is of a four-fetch type.

In the present embodiment, the write flag and write data are transmitted to each DRAM device 40 from the memory controller 20 through the transmission paths which have an equal transmission path length. Therefore, it is assumed that the write data starts to be taken in from the point of the elapse of the predetermined number of clocks from the reach point of the write flag as the count start point. Then, any DRAM device 40 can appropriately take in the write data. That is, when seen from the whole memory system, appropriate data write processing can be performed.

Furthermore, in the present embodiment, the path lengths of the transmission paths of the write flag and write data are also equal to the path length of the transmission path of the reference clock. Therefore, especially without adjusting phase delays of the reference clock, write data, and write flag, the data write processing can appropriately be performed in accordance with the reference clock.

It is to be noted that in the lowermost row in FIG. 4, as apparent from shown deviations of timings of WCLK @ DRAM1 and WCLK @ DRAM2, the reach timings of the reference clock, write flag, and write data in the DRAM2 mounted on the memory module different from that of the DRAM1 shown in the middle row of FIG. 4. As apparent from comparison of various timings shown in the lowermost row with the various timings shown in the middle row, the above-described effect is not an effect which is limited to the DRAM device 40 mounted on one memory module, and the effect can also be obtained with the different memory module. That is, considering one DRAM device 40 regardless of the memory module on which the DRAM device is mounted, a condition that the transmission paths of the write flag and write data have the equal path length is satisfied. Then, the DRAM device 40 can appropriately take in the write data. Moreover, a condition that the path lengths of the transmission paths are equal to the path length of the reference clock is satisfied, and then the data write processing can appropriately be performed in accordance with the reference clock without adjusting the phase delay between the reference clock and the write data or write flag. That is, the above-described effect does not depend on the topology/structure of various signal lines in the whole system.

Moreover, in the present embodiment, the internal C/A bus 60 uses the single T-branch topology. However, a bus topology including a two-stages hierarchy structure (dual T-branch topology) may be used, and an un-buffer type in which the register or buffer is not used may also be used. With the un-buffer type, the external C/A bus 106 is directly connected to the internal C/A bus 60. Furthermore, in the present embodiment, the terminal-end resistances 70 are added to the internal C/A bus 60, but the terminal-end resistances 70 may also be taken as active termination into the DRAM device. Additionally, if satisfactory waveform characteristics can be obtained without using the terminal-end resistances 70, or if system requirements permit, the terminal-end resistances 70 may not be used.

Furthermore, in the above-described embodiment, a type including two different clock domains of the C/A clock and reference clock (WCLK) has been described. However, when the propagation delays of the write data and write flag (WFLG) are in the domain of the reference clock, the above-described effect is obtained. Therefore, for example, a type including a read clock domain for data read may also be used, and all a operations may also be performed only with the reference clock (WCLK).

(Second Embodiment)

Figure 5:
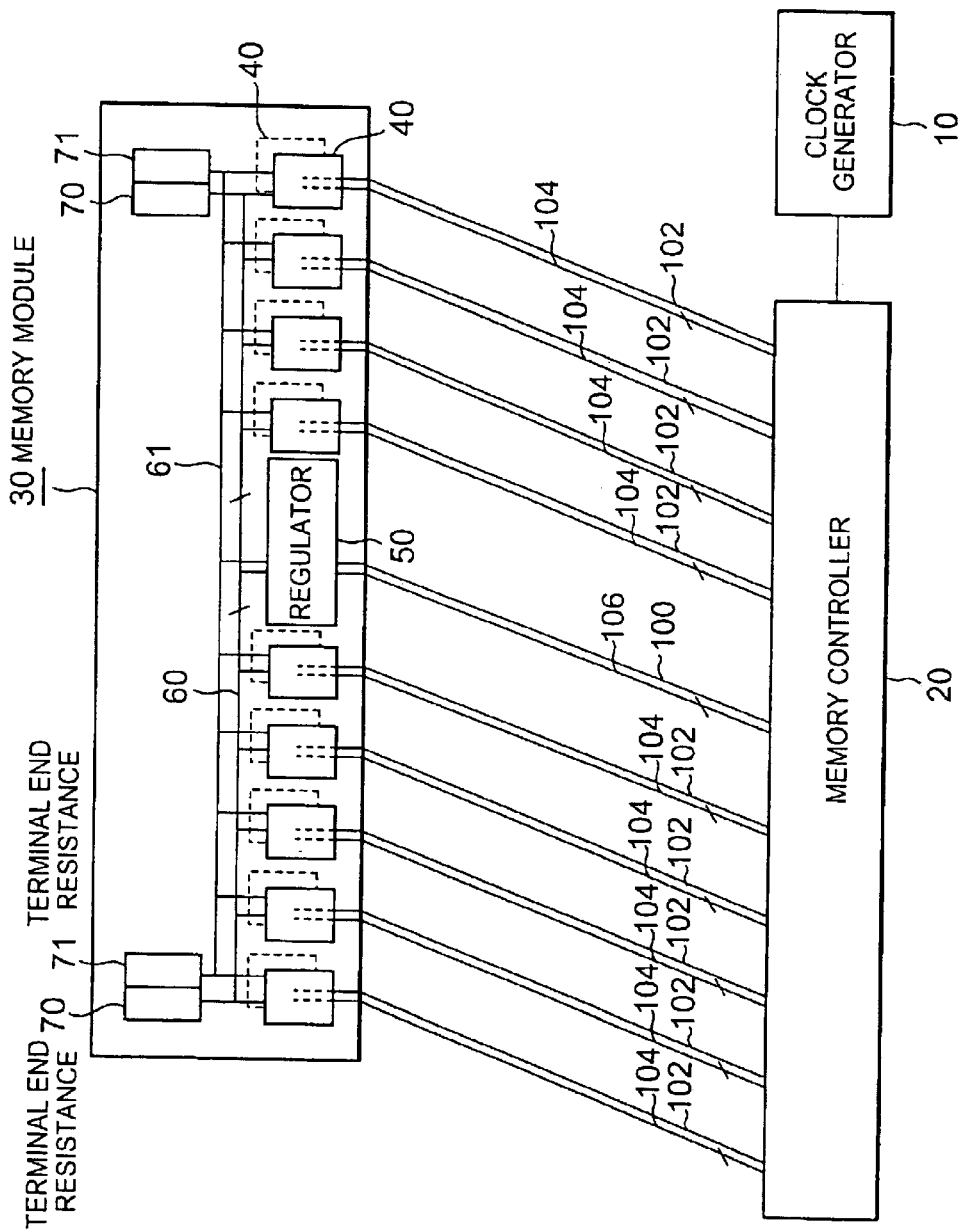
FIG. 5 is a diagram schematically showing the whole constitution of the memory system according to a second embodiment of the present invention.

The memory system according to a second embodiment of the present invention is used, when the propagation delay of the command does not exceed the domain of the reference clock. As shown in FIG. 2, the system includes the clock generator 10, memory controller (chip set) 20, and memory module 30. Even in the present embodiment, the memory controller 20 generates the reference clock (WCLK) based on the clock generated by the clock generator 10. The operations in various memory systems are executed based on the generated reference clock. A plurality of memory modules 30 are usually used, but to simplify the description, only one memory module 30 is shown in FIG. 5 in the same manner as in the first embodiment.

The write flag (WFLG) signal line 100, reference clock (WCLK) signal lines 102, DQ buses 104, and external C/A bus 106 are arranged between the memory controller 20 and memory module 30.

On the memory module 30, a plurality of DRAM devices (memory devices) 40, regulator 50 for temporarily holding the C/A signal and write flag, internal C/A bus 60 for connecting the regulator 50 to each memory device 40, internal WFLG bus 61, and terminal-end resistances 70 and 71 connected to the internal WFLG bus 61 are disposed. The internal C/A bus 60 and internal WFLG bus 61 include the one-stage hierarchy bus structure (so-called single T-branch structure). The terminal-end resistances 70 have a function of preventing the C/A signal from being reflected on the internal C/A bus 60. Similarly, the terminal-end resistances 71 have a function of preventing the write flag from being reflected on the internal WFLG bus 61.

In the present embodiment, each WCLK signal line 102 includes the stub structure, and is connected to each DRAM device 40 mounted on the same surface of the memory module 30 with the equal path length. Similarly, each DQ bus 104 also has the stub structure, and has the equal path length with respect to the plurality of DRAM devices 40 mounted on the same surface of the memory module 30. Furthermore, as understood from FIG. 2, the WCLK signal line 102 and DQ bus 104 with respect to one DRAM device 40 have the same topology. Therefore, the transmission path lengths of the reference clock and (write) data extending to one DRAM device 40 from the memory controller 20 are equal to each other.

On the other hand, the WFLG signal line 100 also has the stub structure, but the input destination is the regulator 50, not each DRAM device 40, which is different from the first embodiment. Furthermore, the write flag outputted from the memory controller 20 and propagated through the WFLG signal line 100 is temporarily held in the regulator 50 as described above, and subsequently transmitted to each DRAM device 40 through the internal WFLG bus 61. Therefore, the transmission path of the write flag includes the WFLG signal line 100, regulator 50, and internal WFLG bus 61. Therefore, when seen from the DRAM device 40, the transmission path of write flag is apparently different from the transmission paths of the reference clock and (write) data.

Similarly, the external C/A bus 106 for transmitting the C/A signal also has the stub structure, but the input destination of the C/A signal in each memory module 30 is the regulator 50, not each DRAM device 40. Furthermore, the C/A signal outputted from the memory controller 20 and propagated through the external C/A bus 106 is temporarily held in the regulator 60 as described above, and subsequently transmitted to each DRAM device 40 through the internal C/A bus 60. Therefore, the transmission path of the C/A signal including the write command includes the external C/A bus 106, regulator 50, and internal C/A bus 60. Therefore, when seen from the DRAM device 40, the transmission path of the C/A signal including the write command is apparently different from the transmission paths of the reference clock and (write) data. However, as apparent from FIG. 2, the transmission paths of the write flag and C/A signal have the same topology.

Even in the present embodiment constituted as described above, the operations of the memory controller 20 and DRAM device 40 are substantially the same as those of the first embodiment. That is, the memory controller 20 includes the reference clock generation unit, command output unit, write flag output unit, and data output unit. In the memory controller 20, when the command output unit outputs the write command in accordance with the reference clock generated in the reference clock generation unit, and a predetermined time elapses from the output of the write command in consideration of data write latency, the write flag output unit outputs the write flag. Furthermore, after the elapse of the predetermined number of clocks from the output of the write flag, the data output unit outputs the write data. On the other hand, on receiving the write command from the memory controller 20, the DRAM device 40 enters the waiting state for the write flag. On receiving the write flag, the DRAM device 40 uses the write flag as the count start point to start counting the predetermined number of clocks, and starts taking in the write data from the point at which the predetermined number of clocks are counted.

In the present embodiment, as described above, the case in which the propagation delay of the command signal does not exceed the reference clock domain is assumed. That is, in the present embodiment, as in the first embodiment, even if the C/A clock is not generated separately from the reference clock, a problem is not generated, and the C/A signal can appropriately be received on each DRAM device 40 side in accordance with the reference clock. Therefore, in the present embodiment, it is not necessary to propagate the C/A clock onto the external C/A bus 106 and internal C/A bus 60. Thereby, the number of pins can be decreased by one. Furthermore, in the present embodiment, nine WFLG signal lines 100 in the first embodiment can be decreased to one. That Is, as compared with the first embodiment, the number of pins can be decreased by eight.

In the above-described second embodiment, the internal C/A bus 60 and internal WFLG bus 61 use the single T-branch topology, but may also use the dual T-branch topology, and may also be of the un-buffer type in which the register or buffer is not used.

Furthermore, in the present embodiment, the terminal-end resistances 70 and 71 are added to the internal C/A bus 60 and internal WFLG bus 61, but the terminal-end resistances 70 and 71 may also be taken as the active termination into the DRAM device 40. Moreover, if the satisfactory waveform characteristics can be obtained without using the terminal-end resistances 70 and 71, or if the system requirements permit, the terminal-end resistances 70 and 71 may not be used.

As described above, according to the present invention, the newly defined write flag is used as the count start point of the write data taking-in timing, and a degree of freedom in the bus constitution is therefore enhanced. Especially when the phase relation between the write flag and write data is held, and the flag and data are inputted on the memory device side, the data write processing on the memory device side can appropriately be performed regardless of the command propagation delay.

What is claimed is:

1. A data writing method in a memory system comprising a memory module on which a plurality of memory devices are mounted and a memory controller which executes a write control with respect to the memory devices, the method comprising the steps of:

defining a write flag;

constituting the memory device so as to hold a predetermined number of clocks and to count the predetermined number of clocks in response to the write flag; and inputting a write command, write flag, and write data, in sequence, into the memory device from the memory controller to execute the write control, so that the memory device uses a point at which the predetermined number of clocks have been counted from write flag input as a taking-in start point of the write data.

2. The data writing method according to claim 1, further comprising the steps of: constituting the memory system so that a transmission path of the write flag to the memory device from the memory controller has the same topology as that of a transmission path of the write data to the memory device from the memory controller.

3. The data writing method according to claim 2, further comprising the steps of: directly inputting the write data and write flag into the plurality of memory devices from the memory controller.

4. The data writing method according to claim 3, further comprising the steps of: disposing a regulator for temporarily holding the write command on the memory module; disposing an internal bus for transmitting the write command to the plurality of memory devices from the regulator; and inputting the write command into the memory device from the memory controller via the regulator and internal bus.

5. The data writing method according to claim 1, further comprising the steps of: constituting the memory system so that a transmission path of the write flag to the memory device from the memory controller has a topology different from that of a transmission path of the write data to the memory device from the memory controller.

6. The data writing method according to claim 5, further comprising the steps of; directly inputting the write data into the plurality of memory devices from the memory controller.

7. The data writing method according to claim 6, further comprising the steps of: disposing a regulator for temporarily holding the write command and write flag on the memory module; disposing first and second internal buses for transmitting the write command and write flag to the plurality of memory devices from the regulator; and inputting the write command and write flag into the memory device from the memory controller via the regulator and first and second internal buses.

8. A memory system comprising:
a memory controller which outputs a write flag, write command, and write data; and
a memory module comprising a plurality of memory devices which hold a predetermined number of clocks and which enter a waiting state of the write flag on receiving the write command and which start taking in the write data from a point of elapse of the predetermined number of clocks from the write flag on receiving the write flag.

9. The memory system according to claim 8, wherein a first transmission path which is a transmission path of the write flag to the memory device from the memory controller has the same topology as that of a second transmission path which is a transmission path of the write data to the memory device from the memory controller.

10. The memory system according to claim 9, wherein the second transmission path comprises DQ buses connected to each of the plurality of memory devices, and the first transmission path comprises WFLG signal lines connected to each of the plurality of memory devices.

11. The memory system according to claim 10, further comprising:
an external command/address bus which transmits a command/address signal including the write command to the memory module from the memory controller, wherein the memory module comprises a regulator for temporarily holding the command/address signal, and an internal command/address bus for distributing the command/address signal to the respective memory devices from the regulator, and the transmission path of the write command to the memory device from the memory controller comprises the external command/address bus, regulator, and internal command/address bus, and has a topology different from that of the first and second transmission paths.

12. The memory system according to claim 8, wherein a first transmission path which is a transmission path of the write flag to the memory device from the memory controller has a topology different from that of a second transmission path which is a transmission path of the write data to the memory device from the memory controller.

13. The memory system according to claim 12, further comprising:
an external command/address bus and a WFLG signal line for transmitting a command/address signal including the write command, and the write flag to the memory module from the memory controller; and a plurality of DQ buses for transmitting the write data to the plurality of memory devices from the memory controller, wherein the second transmission path comprises the plurality of DQ buses.

14. The memory system according to claim 13, wherein the memory module comprises a regulator for temporarily holding the command/address signal and write flag, and an internal command/address bus and internal WFLG bus for distributing the command/address signal and write flag to each memory device from the regulator, the first transmission path comprises the WFLG signal line, regulator, and internal WFLG bus, and the transmission path of the write command to the memory device from the memory controller has a topology which is the same as that of the first transmission path and which is different from that of the second transmission path.

15. A memory module on which a plurality of memory devices are mounted in a memory system including a memory controller for outputting a write command, write flag, and write data for a data write operation,
wherein each of the plurality of memory devices enters a waiting state of the write flag on receiving the write command from the memory controller, starts counting a predetermined number of clocks from the write flag which is a count start point on receiving the write flag, and starts taking in the write data from a point at which the predetermined number of clocks have been counted.

16. A memory controller comprising;
a command output section for outputting a write command;
a write flag output section for outputting a write flag which corresponds to the write command and which indicates a count start point for counting clocks to specify a taking-in start point of the write data in the memory device; and
a data output section for outputting the write data corresponding to the write command after elapse of a predetermined time in consideration of write data latency from when the write flag output section outputs the write flag.

* * * * *